United States Patent [19]

Suzuki et al.

[11] Patent Number: 4,844,784

[45] Date of Patent: Jul. 4, 1989

[54] FLEXIBLE CICUIT SUBSTRATE WITH ELECTROCONDUCTIVE ADHESIVE LAYER AND ITS PRODUCTION

[75] Inventors: Tameyuki Suzuki, Zushi; Takuro Kamakura, Matsudo, both of Japan

[73] Assignee: Shinto Paint Co., Ltd., Amagasaki, Japan

[21] Appl. No.: 808,140

[22] Filed: Dec. 12, 1985

[30] Foreign Application Priority Data

Dec. 20, 1984 [JP] Japan ................................ 59-270302

[51] Int. Cl.[4] ..................... C25D 13/12; C25D 15/00; B32B 31/12
[52] U.S. Cl. .............................. 204/180.9; 204/181.4; 156/151; 428/901
[58] Field of Search .............. 204/181.7, 181.6, 181.4, 204/180.2, 180.9; 156/150, 151, 901, 902; 428/901

[56] References Cited

U.S. PATENT DOCUMENTS

| 3,646,670 | 3/1972 | Maeda et al. | 156/150 |
| 3,752,751 | 8/1973 | Hirose | 204/181.4 |
| 3,892,646 | 7/1975 | Lazzarini et al. | 204/181.4 |
| 3,945,964 | 3/1976 | Hastings et al. | 204/181.3 |
| 4,157,932 | 6/1979 | Hirato | 156/901 |
| 4,676,854 | 6/1987 | Suzuki | 156/151 |

FOREIGN PATENT DOCUMENTS 51-35416 10/1976 Japan ................................. 156/150

Primary Examiner—John F. Niebling
Assistant Examiner—Ben C. Hsing
Attorney, Agent, or Firm—Armstong, Nikaido, Mamelstein, Kubovcik & Murray

[57] ABSTRACT

An electroconductive adhesive layer of high molecular weight resin having electroconductive particles disposed therein is electrodeposited selectively on only the electroconductive circuit povided on a flexible circuit substrate. The adhesive layer permits precise bonding of the coated circuit with an identical circuit provided on a second flexible circuit substrate.

2 Claims, No Drawings

FLEXIBLE CICUIT SUBSTRATE WITH ELECTROCONDUCTIVE ADHESIVE LAYER AND ITS PRODUCTION

The present invention relates to useful flexible circuit substrates for the electroconductive bonding of a substrate having fine electroconductive circuits, and production thereof. More particularly, the present invention relates to useful flexible circuit substrates for attaining electroconductive bonding between fine electroconductive cirtuits used in electronic apparatus, and production thereof.

In display elements so far used in electronic apparatus such as liquid crystals, electrochromic and electroluminescence, simultaneous electroconductive bonding is applied tot he fine multicontact circuit at the end of the elements.

For this, electroconductive bonding should be effected only between the desired circuits without causing conduction-bonding between the undesired adjacent circuits. One means for this is electroconductive bonding with electroconductive anisotropic membrane which is a film-formed product of electroconductive adhesives. Electroconductive anisotropic membranes now in use are produced by dispersing an electroconductive particle-form or fibrous material in an adhesive and forming the resulting dispersion into film. For effecting electroconductive bonding between circuits with this membrane, a strip of this membrane is inserted between two circuit substrates to be bonded together, and the whole is pressed under heating to develop electroconductivity. As an alternative method, there is a method of inserting an electroconductive rubber connector (generally called zebra gum), produced by laminating electroconductive layers and insulating ones alternately, between two circuit substrates to be bonded together, and bonding the whole together under pressure to effect electroconductive bonding. The details of these methods are described, for example, in Electronic Material, Vol.2, No.10, 50–54, 1983 and Technical bulletin on elastic connector, No.199, Toray Industries, Inc.

But, in the method with the electroconductive anisotropic membrane, the electroconductive particle-form or fibrous material dispersed in the adhesive is required to produce electroconductivity in the direction only of circuit, i.e. in the direction only of pressure-bonding, not in the direction normal to the direction of pressure-bonding, i.e. in the lateral direction. But, in the electroconductive bonding of circuit substrates composed of a large number of very fine contact circuits, to ensure no development of electroconductivity in the lateral direction becomes more difficult as the constitution of the circuit becomes finer, as a result of which undesired laterally directed electroconductivity was sometimes developed. Also, the method with zebra gum has a defect that the production of zebra gum itself having a very fine constitution is difficult because there is a limit to the fineness of the constitution.

An object of the present invention is to provide a method of imparting adhesiveness and electroconductivity to a substrate having fine circuits to be connected to permit the electroconductive bonding of said substrate to other circuit substrate, which makes it unnecessary to insert an electroconductive adhesive material such as electroconductive anisotropic membrane or zebra gum between the circuits.

The present invention extensively studied a method for effecting the electroconductive bonding of a fine electroconductive circuit to only the desired adjacent one without causing the undesired adjacent one to conduct, and as a result, found that when an electroconductive adhesive layer is formed on the electroconductive circuit of a flexible circuit substrate by electrodeposition coating of high molecular resins, said desired electroconductive bonding can be attained very surely by bonding said circuit to that of other circuit substrate through said adhesive layer by pressing under heating. The present inventors thus completed the present invention.

According to the present invention, there are provided flexible circuit substrates having an electroconductive adhesive layer formed on their electroconductive circuits by electrodeposition coating of high molecular resins, and a method for producing such flexible circuit substrates.

In the present invention, as the high molecular resin which can form the electroconductive adhesive layer, any of adhesive resins will do which can be electrodeposited on electroconductive substrates (hereinafter referred to as electroconductive circuit) by the electrodeposition coating of high molecular resins described later. As examples of the resins, there are given for example water-soluble or water-dispersible anionic or cationic resins which may take a latex form. These resins include the well-known resins such as epoxy resins, urethane resins, acrylic resins, polyester resins, polybutadiene resins, synthetic rubber resins, etc., and they may be used in combination with crosslinking agents if necessary.

When these resins are anionic, it is preferred that a carboxylic group is introduced into them so that the system has a negative charge, or they are dispersed in water with addition of anionic surface active agents.

When these resins are cationic, it is preferred that an amino group is introduced into them or they are dispersed in water with addition of cationic surface active agents.

In order to make the foregoing high molecular resin electroconductive, electroconductive fine particles are incorporated in the resin. Usable electroconductive fine particles include graphite, carbon black; various electroconductive metallic fine particles (e.g. gold, silver, copper, nickel); and ceramic electroconductive fine particles (e.g. titanium nitride, titanium carbide). These fine particles may be used alone or in mixture of two or more of them.

The amount of the electroconductive fine particle is in the range of 20 to 90 wt.% of the total solid content constituting the adhesive layer. This amount may optionally be changed depending upon the degree of electroconductivity desired for the adhesive layer to be formed. Of these electroconductive fine particles, the ceramic fine particles such as titanium nitride, titanium carbide, etc. are particularly preferred in terms of physical characteristics such as chemical stability, specific gravity, etc.

In producing the electroconductive adhesive, the electroconductive fine particle is incorporated in the electroconductive high molecular resin, previously adjusted to a proper viscosity with water and in some cases, a solvent, by means of the well-known apparatus such as roll mills, pebble mills, sand grind mills, etc. In this case, the anionic or cationic character of the high molecular resin used may be neutralized prior to or after the incorporation.

As the film used for the flexible circuit substrate of the present invention, there are given films used for the common flexible circuits, for example polyester films, polyimide films, etc. The fine electroconductive circuit on the flexible circuit substrate may be formed by any of the conventionally used methods such as photolithography, etching or screen-printing.

In the present invention, the electroconductive adhesive layer is formed on the electroconductive circuit of the flexible circuit substrate by electrodepositing the foregoing electroconductive adhesive produced by incorporating the electroconductive fine particle in the adhesive high molecular resin. For such electrodeposition, a method conventionally known as electrodeposition coating can be used.

In applying the foregoing electrodeposition, an electrodeposition bath is first prepared by adding teh electrodepositable adhesive high molecular resin containing the electroconductive fine particle to an aqueous solution comprising water and if necessary a little organic solvent and additives added as needed; the flexible circuit substrate having an electroconductive circuit on which the electroconductive adhesive layer is to be formed and a counter electrode are placed in said electrodeposition bath; and a direct current voltage is applied across both electrodes.

In this case, when the adhesive high molecular resin is of an anionic character, direct current voltage is applied with the circuit substrate to be coated as a positive electrode and the counter electrode as a negative electrode. When said adhesive high molecular resin is of a cationic character, the signs of the electrodes are reversed.

As a condition for electrodeposition, it is generally good to apply direct current of 5 to 300 volts for 1 to 60 seconds to electrodeposit an electroconductive adhesive layer of about 1 to about 20 $\mu$ in dry thickness. The thickness of this layer is properly determined depending upon the degree of fineness of the electroconductive circuit to be coated, the precision of the thickness, etc., which can be attained by controlling the aforementioned electrodeposition condition. Generally, it is good that the finer the constitution of the circuit, the thinner the thickness of the electroconductive adhesive layer to be formed is made. The reason for this is that the electroconductive adhesive layer is prevented from being pushed out laterally when other circuit substrate has been pressed against it.

The flexible circuit substrate on which the electroconductive adhesive layer has been electrodeposited as described above is then taken out of the bath and washed with pure water to wash off the excessive solution of the bath which has simply adhered to the substrate. Thereafter, the electrodeposited adhesive layer is dried. This drying is carried out under a condition that the adhesive layer is not cured, but water and the organic solvent contained in the layer can be removed. Generally, it is good to carry out drying at a temperature loewr than 80° C. under reduced pressure or atmospheric pressure.

According to the electrodeposition method of the present invention to form the electroconductive adhesive layer composed of electroconductive high molecular resins, very uniform coating films can be formed faithfully on only the desired electroconductive circuit. Because of this, the adhesive layer can be formed more effectively on the electroconductive circuit as the circuit pattern becomes finer, i.e. both the width of the electroconductive circuit and intervals between the circuits become smaller. Particularly, the method of the present invention is useful for the electroconductive bonding of multicontact circuits having many electroconductive circuits of 0.1 mm or less in width at intervals of 0.2 mm or less between the circuits, which was impossible or difficult by other well-known methods.

Generally, when another circuit is bonded to the electroconductive circuit under pressure to bring about conduction, as the width of the electroconductive circuit and intervals between the circuits become finer, the problem of the adhesive layer being pushed out into the portion between the circuits becomes more serious. In order to prevent the adhesive layer from being pushed out, it is preferred that the thickness of the layer is as small as possible so far as the limit is not passed. In order to bring about conduction between the circuits by bonding them together under pressure through the thinnest possible adhesive layer, it is preferred that the circuit substrate to be electrodeposition-coated with the electroconductive adhesive layer is a flexible substrate.

In order to bond the flexible circuit substrate, the electroconductive circuit of which has been coated with the electroconductive adhesive layer by electrodeposition coating of high molecular resins according to the present invention, to other circuit substrate, thereby bringing about conduction between the circuits, the circuits are placed in position and bonded together by pressing under heating. By this, circuit bonding giving electroconductivity in the direction only of pressing can be attained with a very high reliability. When the adhesive layer is a thermoplastic high molecular resin, the bonding is carried out at a temperature at which the resin is plasticized or molten a little to give a good bonding strength, and when the resin is a thermosetting one, the bonding is carried out under the curing condition for the resin.

The present ivnention will be illustrated below with reference to the following examples.

EXAMPLE 1

(1) 20 Copper circuits of 80 $\mu$ in width were formed by etching on a polyester film substrate at intervals of 80 $\mu$.

(2) An electrodeposition bath containing an electroconductive adhesive high molecular resin was prepared so as to have the following composition:

| | Parts by weight |
|---|---|
| Anionic polyester resin solution (product of Shinto Paint Co., Ltd.; ethyl cellosolve/sec-butanol solution having a solid content of 75 wt. %) | 64 |
| Melamine resin (MX-40; product of Sanwa Chemical Co.) | 12 |
| Titanium nitride (product of Nihon Shinkinzoku Co.; average particle diameter, 1 $\mu$) | 120 |
| Graphite | 20 |
| Ethyl cellosolve | 80 |
| Triethylamine | 3 |
| Deionized water | 701 |
| Total | 1000 |

In preparing the above electrodeposition bath, the resin solution, melamine resin, titanium nitride and graphite were mixed, and the viscosity of the mixture was properly adjusted with addition of a part of ethyl cellosolve. The mixture was kneaded on a pebble mill for 8 hours to disperse the electroconductive powders in the resin solution. Thereafter, triethylamine and the residual ethyl cellosolve were added and well mixed to neutralize the resin, and the deionized water was added to prepare the bath having a solid content of 20 wt.%.

(3) The adhesive layer was formed as follows:

The electrodeposition bath prepared in (2) was added to a glass beaker and kept at 25° C. with thorough stirring.

Prior to dipping the circuit film prepared in (1) in electrodeposition bath, the film was masked with a tape so that the portion of every circuit extending 5 mm from the edge of the circuit film remained exposed, by which method portions other than said portion of every circuit were protected from electrodeposition coating.

This circuit film and a stainless steel counter electrode having the same area as that of the film were dipped in the electrodeposition bath so that the both faced each other at a distance of 5 cm. With every copper circuit on the circuit film as a positive electrode and the other as a negative electrode, a direct current of 60 V was applied for 10 seconds across the electrodes to electrodeposit the adhesive on the electroconductive circuits. After completion of electrodeposition coating, the circuit film was taken out of the bath, and after removing the masking tape, washed with deionized water to wash off the solution of the bath which had simply adhered thereto. The adhesive layer was then dried at 80° C. for 5 minutes under reduced pressure. The thickness of the adhesive layer formed was about 10 $\mu$.

(4) The flexible circuit substrate having the electroconductive adhesive layer formed as described above was bonded to other circuit substrate as follows:

This circuit film and the same kind of circuit film having no adhesive layer were placed one upon another so that the circuits on the films were in position, and bonded together at 190° C. for 5 minutes under a pressure of 20 kg/cm$^2$. The bonding of the both circuit films was good with no electric short between the adjacent circuits, and yet with very good conduction between the desired circuits.

EXAMPLE 2

(1) 10 Copper circuits of 50 $\mu$ in width were formed by etching on a polyimide film substrate at intervals of 50 $\mu$.

(2) An electrodeposition bath containing an electroconductive adhesive high molecular resin was prepared so as to have the following composition:

|  | Parts by weight |
|---|---|
| Cationic urethane-modified epoxy resin solution (product of Shinto Paint Co., Ltd.; ethyl cellosolve/toluene solution having a solid content of 75 wt. %) | 93.4 |
| Titanium carbide (product of Nihon Shinkinzoku Co.; average particle diameter, 1$\mu$) | 120 |
| Carbon black | 10 |
| Ethyl cellosolve | 90 |
| Acetic acid (50%) | 4.6 |
| Deionized water | 682 |
| Total | 1000 |

In preparing the above electrodeposition bath, the resin solution, titanium carbide and carbon black were mixed, and the viscosity of the mixture was properly adjusted with addition of a part of ethyl cellosolve. The mixture was kneaded on a sand grind mill for 8 hours to disperse the electroconductive powders in the resin solution. Thereafter, acetic acid and the residual ethyl cellosolve were added and well mixed to neutralize the resin, and the deionized water was added to prepare the bath having a solid content of 20 wt.%.

(3) The adhesive layer was formed as follows:

The adhesive layer was formed according to the method shown in (3) of Example 1. In this example, however, the circuit film prepared in (1) was a negative electrode; the counter electrode was a positive electrode; the distance between the electrodes was 5 cm; and a direct current of 50 V was applied for 20 seconds.

The adhesive layer was dried at 80° C. for 5 minutes under reduced pressure to find that the thickness of the layer was about 5$\mu$.

(4) In the same manner as in Example 1, the flexible circuit film having the electroconductive adhesive layer formed as described above and other circuit film having the same circuit were placed one upon another so that the circuits on the films were in position, and bonded together at 200° C. for 5 minutes under a pressure of 10 kg/cm$^2$. The bonding of both circuit films was good with no electric short between the adjacent circuits, and yet with very good conduction between the desired circuits.

According to the method of the present invention, the electroconductive adhesive layer can be formed precisely and faithfully on the fine electroconductive circuit, and bonding between the desired circuits can surely be attained with a very good electroconductivity.

What is claimed is:

1. A method of providing electroconductive bonding between a first flexible circuit substrate provided with at least one electroconductive circuit which has a width of 0.1 mm or less and a second flexible circuit substrate provided with at least one electroconductive circuit which has a width of 0.1 mm or less and which is identical to the electroconductive circuit on the first flexible circuit substrate and is provided on the surface of the second flexible circuit substrate which faces the first flexible circuit substrate, said method comprising the steps of forming by electrodeposition on the electroconductive circuit on the first flexible circuit substrate electroconductive adhesive layer consisting essentially of a high molecular resin and electroconductive particles of titanium carbide or titanium nitride dispersed therein, whereby said electroconductive layer is formed selectively on said electroconductive circuit on the first flexible circuit substrate, then bringing said electroconductive adhesive layer on the first flexible circuit substrate into contact with the electroconductive circuit on the second flexible circuit substrate so that the electroconductive circuits on the respective flexible circuit substrates are aligned with each other and bonded through the electroconductive adhesive layer.

2. A method as described in claim 1, wherein there is a plurality of electroconductive circuits on at least two of the flexible circuit substrates and the interval between adjacent electroconductive circuits on a flexible circuit substrate is 0.2 mm or less.

* * * * *